(12) United States Patent
Han

(10) Patent No.: US 9,771,645 B2
(45) Date of Patent: Sep. 26, 2017

(54) APPARATUS FOR DEPOSITION AND SUBSTRATE ALIGNMENT METHOD IN THE SAME

(71) Applicant: Samsung Display Co., Ltd., Yongin, Gyeonggi-Do (KR)

(72) Inventor: Jeong Won Han, Seongnam-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 22 days.

(21) Appl. No.: 14/792,443

(22) Filed: Jul. 6, 2015

(65) Prior Publication Data

US 2016/0186305 A1 Jun. 30, 2016

(30) Foreign Application Priority Data

Dec. 26, 2014 (KR) ........................ 10-2014-0191113

(51) Int. Cl.
| | |
|---|---|
| *C23C 14/04* | (2006.01) |
| *C23C 14/50* | (2006.01) |
| *H01L 21/683* | (2006.01) |
| *H01L 21/3213* | (2006.01) |
| *H01L 51/00* | (2006.01) |
| *C23C 16/04* | (2006.01) |

(Continued)

(52) U.S. Cl.
CPC .......... *C23C 14/042* (2013.01); *B05C 21/005* (2013.01); *C23C 14/50* (2013.01); *C23C 16/042* (2013.01); *H01L 21/32139* (2013.01); *H01L 21/6831* (2013.01); *H01L 21/6833* (2013.01); *H01L 51/0011* (2013.01); *H02N 13/00* (2013.01)

(58) Field of Classification Search
CPC ... B05C 21/005; C23C 16/042; C23C 14/042; C23C 14/50; H02N 13/00; H01L 21/6831; H01L 51/0011; H01L 21/6833; H01L 21/32139
USPC ....... 118/726, 728, 721, 504, 505, 620, 621, 118/623, 50; 156/345.51, 345.3, 345.28; 29/464
See application file for complete search history.

(56) References Cited

U.S. PATENT DOCUMENTS

| | | | |
|---|---|---|---|
| 7,015,154 B2 * | 3/2006 | Yamazaki | C23C 14/564 118/725 |
| 8,246,748 B2 * | 8/2012 | Mitchell | C23C 14/044 118/726 |

FOREIGN PATENT DOCUMENTS

| | | |
|---|---|---|
| JP | 2002-064134 A | 2/2002 |
| JP | 2004-235563 A | 8/2004 |

(Continued)

*Primary Examiner* — Laura Edwards
(74) *Attorney, Agent, or Firm* — Knobbe Martens Olson & Bear LLP

(57) ABSTRACT

A deposition apparatus is disclosed. In one aspect, the apparatus includes a metal sheet of which an edge portion is integrally combined with a sheet frame and an electrostatic chuck attached to a bottom surface of the metal sheet and configured to pull a substrate based on a static electricity force. The apparatus also includes a metal mask placed below the electrostatic chuck, wherein an edge portion of the metal mask is combined with a mask frame, and wherein the metal mask has a predetermined patterned opening where the substrate is mounted to the upper surface thereof. The apparatus further includes a magnet plate placed above the metal sheet, and configured to pull the metal mask based on a magnetic force so as to attach the substrate to the electrostatic chuck.

10 Claims, 9 Drawing Sheets

(51) Int. Cl.
*B05C 21/00* (2006.01)
*H02N 13/00* (2006.01)

(56) References Cited

FOREIGN PATENT DOCUMENTS

| | | |
|---|---|---|
| JP | 2014-065959 A | 4/2014 |
| KR | 10-2009-0108420 A | 10/2009 |
| KR | 10-1307153 B1 | 9/2013 |
| KR | 10-1310336 B1 | 9/2013 |

* cited by examiner

APPARATUS FOR DEPOSITION AND SUBSTRATE ALIGNMENT METHOD IN THE SAME

INCORPORATION BY REFERENCE TO ANY PRIORITY APPLICATIONS

This application claims priority to and the benefit of Korean Patent Application No. 10-2014-0191113 filed in the Korean Intellectual Property Office on Dec. 26, 2014, the entire contents of which are incorporated herein by reference.

BACKGROUND

Field

The described technology generally relates to a deposition apparatus and a method for aligning a substrate in the deposition apparatus.

Description of the Related Technology

In general, it is important to maintain a mask and a substrate in close proximity during deposition for uniform deposition of a pattern having a well-defined shape. If the deposition process is performed while the mask and the substrate are separated, the thin film pattern may be non-uniformly formed (for example, the shape of the thin film deposition pattern may extend the outline of the slit).

SUMMARY OF CERTAIN INVENTIVE ASPECTS

One inventive aspect relates to a deposition apparatus for deposition of an organic material on a substrate, and a substrate aligning method in the deposition apparatus.

Another aspect is a deposition apparatus that can reduce the degree of slack in the substrate using an electrostatic chuck in installation of a substrate, and a method for aligning the substrate in the deposition apparatus.

Another aspect is a deposition apparatus that includes: a metal sheet of which an edge portion is integrally combined with a sheet frame; an electrostatic chuck attached to a bottom surface of the metal sheet and absorbing a substrate using a static electricity force; a metal mask provide below the electrostatic chuck, of which an edge portion is combined with a mask frame, and having a predetermined patterned opening where the substrate is mounted to the upper surface thereof; and a magnet plate provided above the metal sheet, and attaching the substrate to the electrostatic chuck by pulling the metal mask using a magnetic force.

The deposition apparatus according to the exemplary embodiment further includes a sheet frame driving transferring the sheet frame up or down and a magnet plate driver transferring the magnet plate up or down.

The electrostatic chuck is a film type of electrostatic chuck.

The electrostatic chuck may be attached to the metal sheet while being convex downward.

The magnet plate may be formed as a permanent magnet or an electromagnet.

The metal mask may be a fine metal mask.

A substrate aligning method according to another exemplary embodiment includes: mounting a substrate to a metal mask of which an edge portion is combined with a mask frame; attaching the substrate to an electrostatic chuck by moving a metal sheet of which an edge portion is integrally combined with a sheet frame and to which the electrostatic chuck is attached down toward the metal mask; attaching the substrate to an electrostatic chuck by moving a metal sheet of which an edge portion is integrally combined with a sheet frame and to which the electrostatic chuck is attached down toward the metal mask; attaching the substrate to the metal mask using a magnetic force by moving the magnet plate attached with the metal sheet down toward the metal mask.

Another aspect is a substrate aligning method that includes: mounting a substrate to a metal mask of which an edge portion is combined with a mask frame; attaching the substrate to an electrostatic chuck by moving a metal sheet of which an edge portion is integrally combined with a sheet frame and to which the electrostatic chuck is attached down toward the metal mask; and attaching the substrate to the metal mask using a magnetic force by moving the magnet plate provided above the metal sheet down toward the metal mask.

According to at least one of the disclose embodiments, the substrate can be prevented from being slack, and accordingly a change in locations of hole patterns on the mask due to the slack in the substrate can be prevented, thereby improving deposition location accuracy and reducing deposition failure.

In addition, as the deposition failure is decreased, productivity can be improved and production cost can be lowered.

Further, as the deposition location accuracy is improved, a high-resolution deposition process can be performed.

Another aspect is a deposition apparatus comprising: a metal sheet of which an edge portion is integrally combined with a sheet frame; an electrostatic chuck attached to a bottom surface of the metal sheet and configured to pull a substrate based on a static electricity force; a metal mask placed below the electrostatic chuck, wherein an edge portion of the metal mask is combined with a mask frame, and wherein the metal mask has a predetermined patterned opening where the substrate is mounted to the upper surface thereof; and a magnet plate placed above the metal sheet, and configured to pull the metal mask based on a magnetic force so as to attach the substrate to the electrostatic chuck.

The above apparatus further comprises: a sheet frame driver configured to transfer the sheet frame up or down; and a magnet plate driver configured to transfer the magnet plate up or down. In the above apparatus, the electrostatic chuck comprises a film type of electrostatic chuck. In the above apparatus, the electrostatic chuck is configured to be attached to the metal sheet while being convex downward. In the above apparatus, the magnet plate is formed of a permanent magnet or an electromagnet. In the above apparatus, the metal mask comprises a fine metal mask. In the above apparatus, the metal sheet and the electrostatic chuck have substantially the same curvature.

In the above apparatus, the magnet plate is placed directly above the metal sheet. In the above apparatus, the electrostatic chuck is configured to be placed directly above the substrate. In the above apparatus, the magnet plate, the metal sheet, the electrostatic chuck and the metal mask overlap in the direction of the magnetic force. In the above apparatus, the magnet plate, the metal sheet, the electrostatic chuck and the metal mask are placed inside a chamber. The above apparatus further comprises a deposition source placed inside the chamber and configured to supply a deposition material to the metal mask.

Another aspect is a substrate aligning method comprising: mounting a substrate to a metal mask, wherein an edge portion of the metal mask is combined with a mask frame; moving a metal sheet so as to attach the substrate to an electrostatic chuck, wherein an edge portion of the metal sheet is integrally combined with a sheet frame and wherein the electrostatic chuck is attached to the metal sheet down toward the metal mask; moving the metal sheet up while the substrate is attached to the electrostatic chuck so as to attach the metal sheet to a magnet plate placed above the metal sheet; and moving the magnet plate attached with the metal sheet down toward the metal mask so as to attach the substrate to the metal mask based on a magnetic force.

In the above method, the metal sheet and the electrostatic chuck have substantially the same curvature. In the above method, the magnet plate, the metal sheet, the electrostatic chuck and metal mask overlap in the direction of the magnetic force. In the above method, the magnet plate, the metal sheet, the electrostatic chuck and the metal mask are placed inside a chamber. The above method further comprises a deposition source placed inside the chamber and configured to supply a deposition material to the metal mask.

Another aspect is a substrate aligning method comprising: mounting a substrate to a metal mask, wherein an edge portion of the metal mask is combined with a mask frame; moving a metal sheet so as to attach the substrate to an electrostatic chuck, wherein an edge portion of the metal sheet is integrally combined with a sheet frame and wherein the electrostatic chuck is attached to the metal sheet down toward the metal mask; and moving a magnet plate placed above the metal sheet down toward the metal mask so as to attach the substrate to the metal mask based on a magnetic force.

In the above method, the metal sheet and the electrostatic chuck have substantially the same curvature. In the above method, the magnet plate, the metal sheet, the electrostatic chuck and metal mask overlap in the direction of the magnetic force.

DETAILED DESCRIPTION OF CERTAIN INVENTIVE EMBODIMENTS

Figure 1:
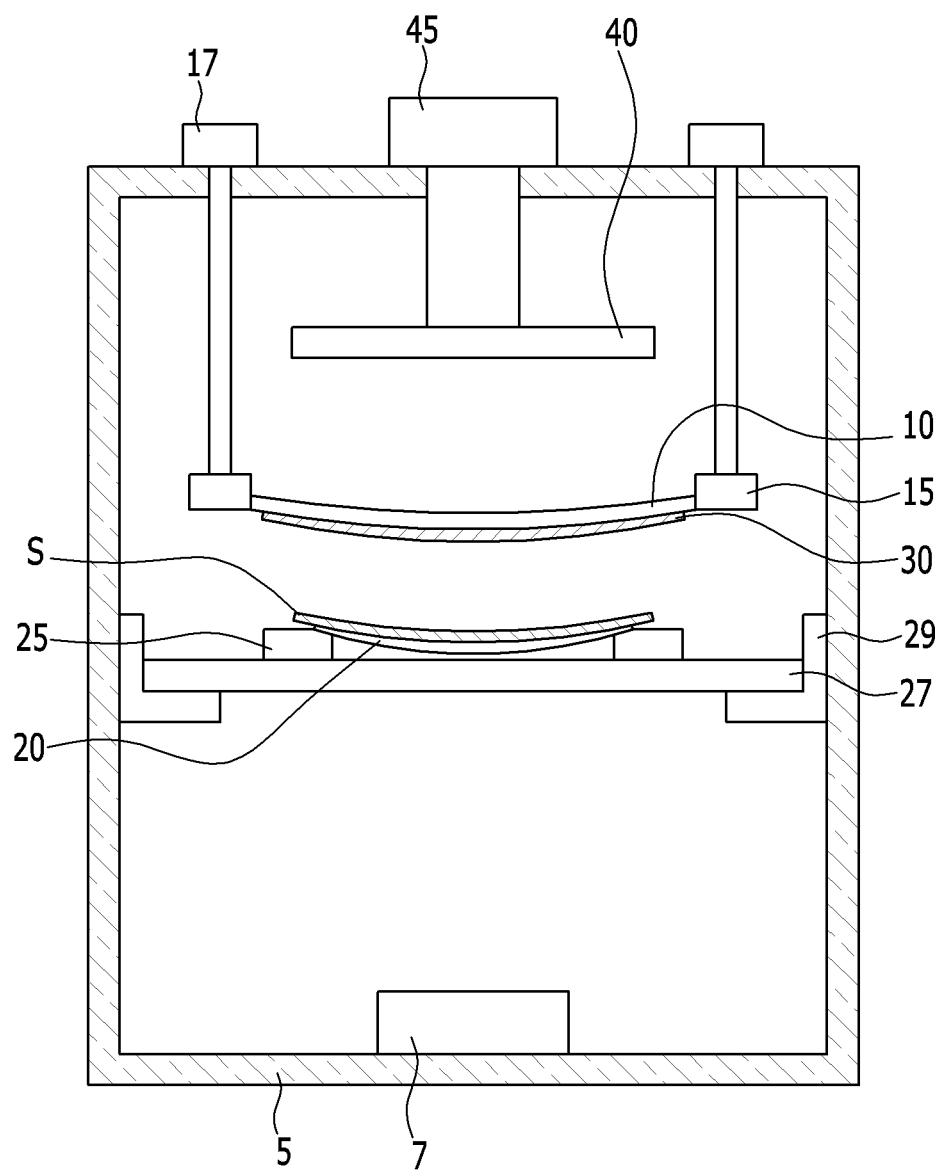
FIG. 1 schematically illustrates a deposition apparatus according to an exemplary embodiment.

In order to solve the issue of non-uniformity in a thin film deposition pattern, a cool plate is generally provided above a substrate so as to attach the substrate to the mask by pushing the substrate toward the mask and pressing the substrate from above toward the mask during deposition.

However, when the substrate is pressed using the cool plate, a center portion of the substrate can slacken (compared to edges of the substrate) even though the degree of slack is reduced to some degree by gravity.

When the substrate is pressed from above, the substrate may not be completely flattened. For example, when a glass substrate having a thickness of 0.4 mm, a width of 750 mm, and a height of 650 mm, was pressed, the substrate was slack about 340 μm according to experimental results.

When the substrate is slack, the location of the hole pattern on the mask changes, hole patterns are located at their designed locations on the mask when properly flattened. However, when the mask is pressed by the substrate that is not flat, the locations of the hole patterns may change.

As the locations of the hole patterns on the mask change, the location of a material deposited on the substrate changes, thereby causing anomalous patterning. Particularly, the deposition location change due to the slack substrate causes more critical deposition failure in a deposition process of a high-resolution product.

The described technology will be described more fully hereinafter with reference to the accompanying drawings, in which exemplary embodiments are shown. As those skilled in the art would realize, the described embodiments may be modified in various different ways, all without departing from the spirit or scope of the present invention.

It shall be noted that the drawings are schematic and do not depict exact dimensions. The relative proportions and ratios of elements in the drawings may be exaggerated or diminished in size for the sake of clarity and convenience in the drawings, and such arbitrary proportions are only illustrative and not limiting in any way. Like reference numerals are used for like structures, elements, or parts shown in two or more drawings to show similar characteristics. When one part is said to be "over" or "on" another part, the one part may be directly over the other part or may be accompanied by another part interposed therebetween.

Since the disclosed exemplary embodiments are merely examples, various modifications of the drawings are possible. The exemplary embodiments are not limited to certain forms of the regions illustrated, for example, includes modifications of a manufactured form. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Hereinafter, a deposition apparatus according to an exemplary embodiment will be described with reference to FIG. 1.

FIG. 1 schematically illustrates a deposition apparatus 100 according to an exemplary embodiment. Depending on embodiments, certain elements may be removed from or additional elements may be added to the deposition apparatus 100 illustrated in FIG. 1. Furthermore, two or more elements may be combined into a single element, or a single element may be realized as multiple elements. This applies to the remaining apparatus embodiments. Referring to FIG. 1, the deposition apparatus 100 includes a metal sheet 10 provided in a vacuum deposition chamber 5, an electrostatic chuck 30 attached to a bottom surface of the metal sheet 10, a metal mask 20 provided below the electrostatic chuck 30, a magnet plate 40 provided above the metal sheet 10, and a deposition material supply source 7 provided below the metal mask 20 to supply a deposition material to the metal mask 20.

The vacuum deposition chamber 5 can limit a space where a process is performed. The metal sheet 10, the electrostatic chuck 30, the metal mask 20, the magnet plate 40, and the deposition material supply source 7 are placed in the vacuum deposition chamber 5.

In the metal sheet 10, a sheet frame 15 and an edge portion can be integrally combined. The sheet frame 15 can be connected to a sheet driver 17 provided in an outer side of the vacuum deposition chamber 5, and transferred up and down by the sheet driver 17.

The electrostatic chuck 30 can be attached to the bottom surface of the metal sheet 10 and can absorb a substrate S by a static electricity force. The electrostatic chuck 30 can be attached to the substrate S using static electricity. As '+' or '−' potential is applied, the electrostatic chuck 30 is accordingly charged and thus with '+' or '−' potential such that a force that pulls the substrate S is generated and the substrate S is attached thereto. A file type of electrostatic chuck 30 may have a flexible characteristic so that the electrostatic chuck 30 may be curved according to the curve of the metal sheet 10 attached thereto.

The metal mask 20 is provided below the electrostatic chuck 30, and a mask frame 25 and an edge portion of the metal mask 20 are coupled to each other, and an opening having a predetermined pattern is formed in the metal mask 20. The substrate S is mounted to the upper surface of the metal mask 20. The mask frame 25 is provided above a mask stage 27, and the mask stage 27 is in a state of being mounted on a support member 29 fixed to an inner wall of the vacuum deposition chamber 5. The metal mask 20 may be a fine metal mask (FMM).

FIG. 1 illustrates a state that the substrate S is mounted on the metal mask 20 before being aligned, and the substrate S is convex downward together with the metal mask 20 due to the weight of the substrate S. The convex metal mask 20 is flattened by a magnetic force of the magnet plate 40 as the magnet plate 40 moves toward the metal mask 20 such that the substrate S and the electrostatic chuck 30 are more closely attached.

The magnet plate 40 is provided above the metal sheet 10, and the substrate S is attached to the electrostatic chuck 30 by the magnetic force of the metal mask 20. The magnet plate 40 is connected to a magnet plate driver 45 provided in an outer side of the vacuum deposition chamber 5 and then transferred up and down. The magnet plate 40 can be formed of a permanent magnet, or a metal piece and thus may be used as an electromagnet by flowing a current thereto. When the magnet plate 40 is used as an electromagnet, intensity of the magnetic force can be controlled by adjusting the amount of current flowing to the electromagnet.

Figure 2:
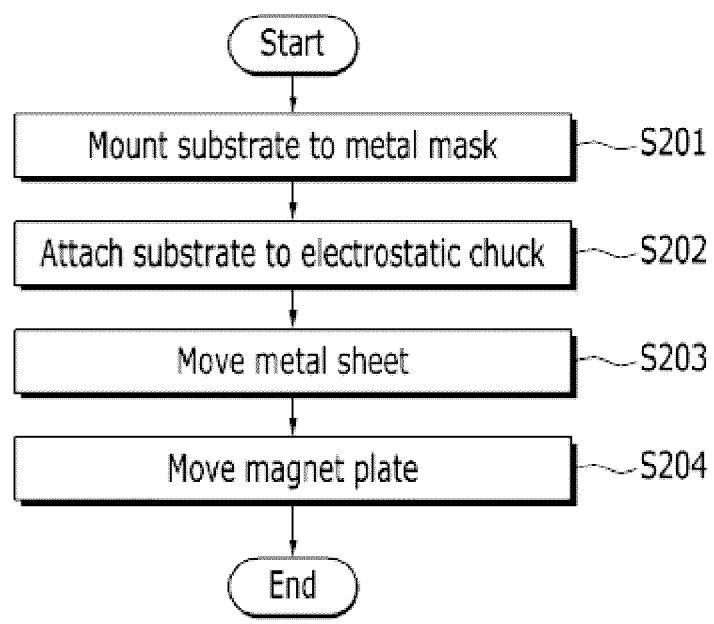
FIG. 2 is a flowchart illustrating a substrate aligning method according to an exemplary embodiment.

FIG. 2 is a flowchart of a substrate aligning method according to an exemplary embodiment. Depending on embodiments, additional states may be added, others removed, or the order of the states changed in the procedure of FIG. 2. This applies to the remaining method embodiments. FIG. 3A to FIG. 3D are process cross-sectional views of the substrate aligning method according to the exemplary embodiment.

Figure 3A:
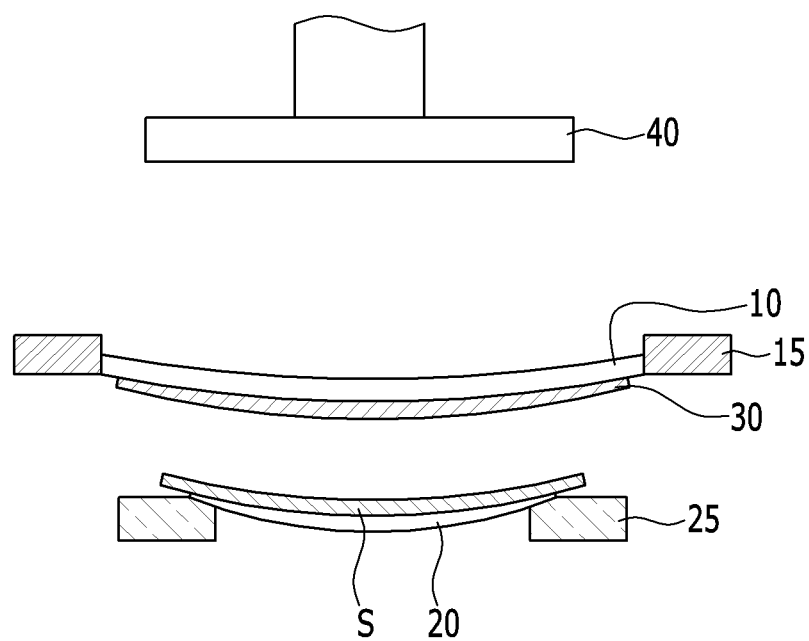
FIG. 3A to FIG. 3D are process cross-sectional views of the substrate aligning method according to the exemplary embodiment.
Figure 3B:
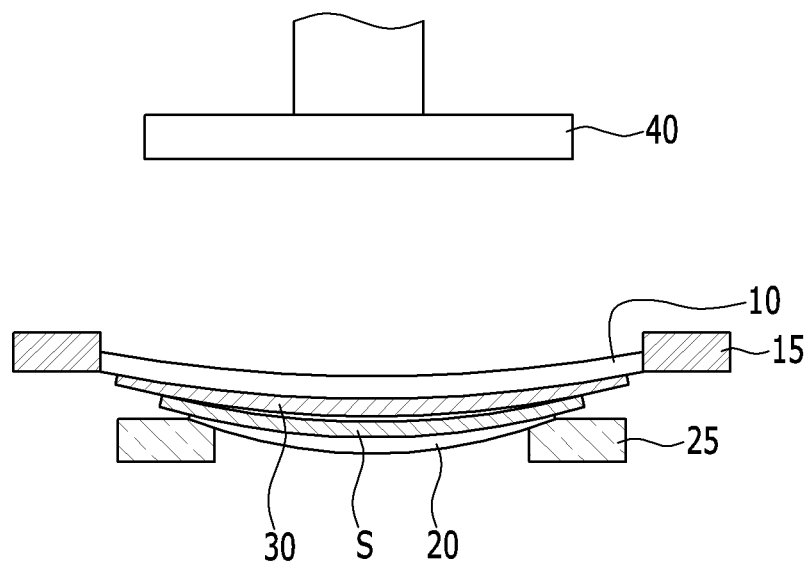
Figure 3C:
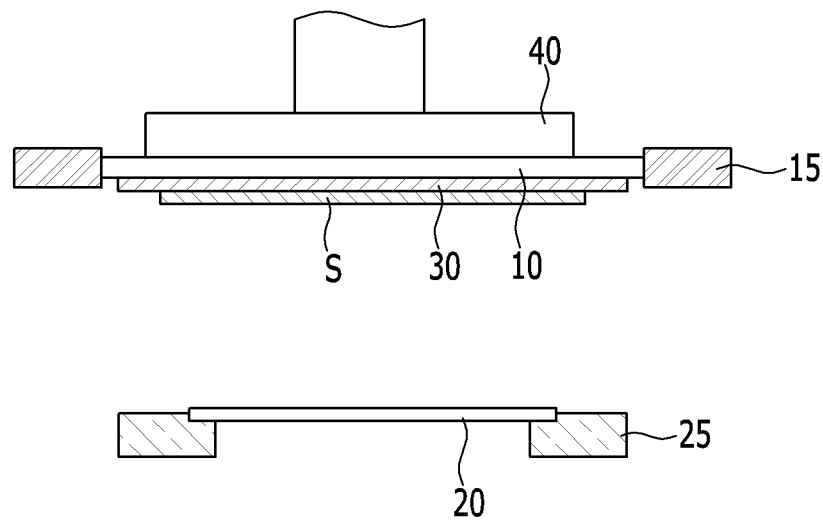
Figure 3D:
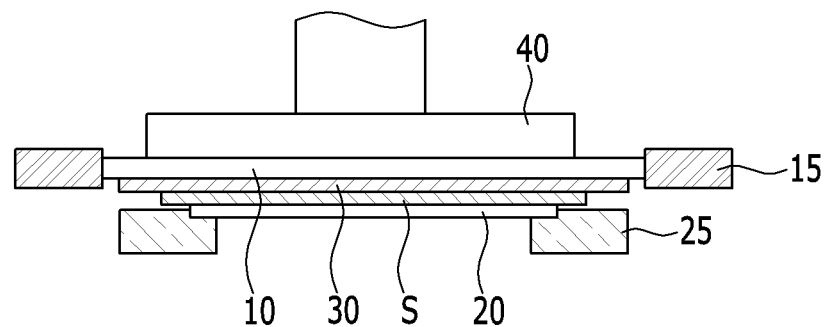

Referring to FIG. 2 to FIG. 3D, the substrate aligning method includes a substrate mount step S201, a substrate attachment step S202, a metal sheet movement step S203, and a magnet plate movement step S204.

First, referring to FIG. 3A, in the substrate mount step S201, the substrate S is carried into the vacuum deposition chamber 5 and the substrate S is mounted to the metal mask 20. An edge portion of the metal mask 20 is coupled with the mask frame 25. In this case, the substrate S may be formed of large-sized glass, and is convex downward together with the metal mask 20 due to the weight of the substrate S.

Next, referring to FIG. 3B, in the substrate attachment step S202, the electrostatic chuck 30 provided above the metal mask 20 moves the metal sheet 10 down toward the metal mask 20 such that the substrate S is attached to the electrostatic chuck 30. An edge portion of the metal sheet 10 may be integrally combined with the sheet frame 15. The substrate S may be absorbed to the bottom surface of the metal sheet 10, and the substrate S is charged with '+' or '−' potential as '+' or '−' potential is applied thereto. Then, a force that pulls the substrate S is generated and thus the substrate S is attached to the electrostatic chuck 30. The sheet frame 15 is connected with the sheet driver 17, and the metal sheet 10 may move down toward the metal mask 20 by a descending operation of the sheet driver 17.

Next, referring to FIG. 3C, in the metal sheet movement step S203, the metal sheet 10 is moved upward to be attached to the magnet plate 40 provided above the metal sheet 10 while the substrate S is attached to the electrostatic chuck 30. Due to an ascending operation of the sheet driver 17 connected to the sheet frame 15, the metal sheet 10 is lifted and thus may be attached to the magnet plate 40 provided above the metal sheet 10 while the substrate S is attached to the electrostatic chuck 30. In this case, the magnetic force of the magnet plate 40 is applied and thus the metal sheet 10 is pulled upward, and accordingly the substrate S is substantially flattened. When the metal sheet 10 is moved upward in S203, the substrate S is substantially flattened above the metal mask 20 using the magnetic force of the magnet plate 40 before the magnet plate 40 pulls the metal mask 20 in S204 to make the substrate S flat so that alignment of the substrate S can be more improved.

Next, referring to FIG. 3D, in the magnet plate movement step S204, the magnet plate 40 attached with the metal sheet 10 moves down toward the metal mask 20 so that the substrate S is attached to the metal mask 20. The magnet plate 40 is connected to the magnet plate driver 45 (refer to FIG. 1), and the magnet plate 40 moves down by a descending operation of the magnet plate driver 45. When the magnet plate 40 is attached to the metal mask 20, the metal mask 20 is pulled upward by the magnetic force of the magnet plate 40 so that the substrate S is substantially flattened and at the same time an adhesive force between the substrate S and the metal mask 20 can be stronger.

Figure 4A:
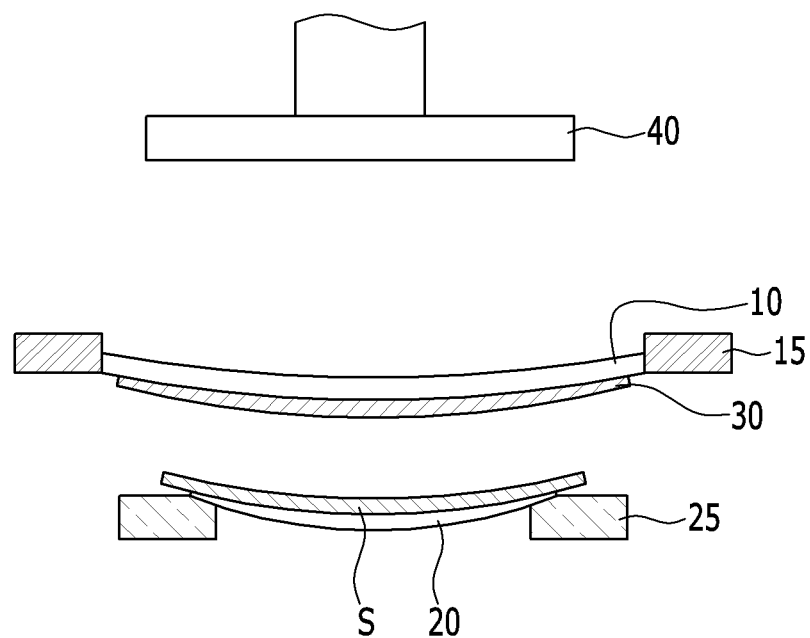
FIG. 4A to FIG. 4C are process cross-sectional views of a substrate aligning method according to another exemplary embodiment.
Figure 4B:
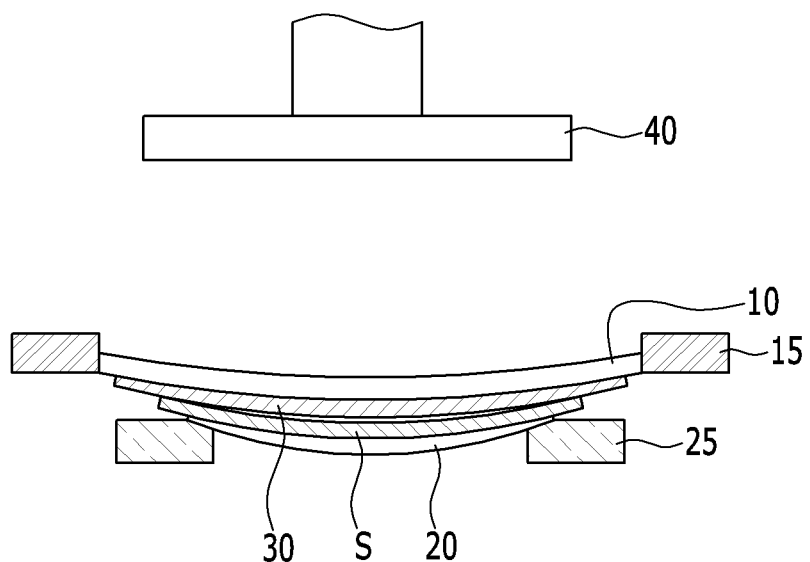
Figure 4C:
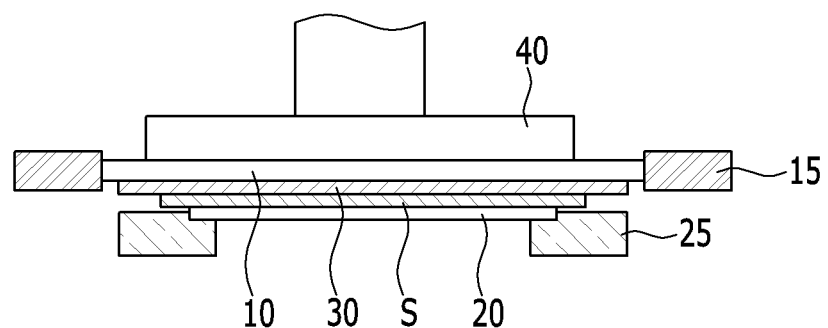

FIG. 4A to FIG. 4C are process cross-sectional views of a substrate aligning method according to another exemplary embodiment.

Referring to FIG. 4A to FIG. 4C, the substrate aligning method includes i) mounting a substrate S to a metal mask 20 of which an edge portion is combined with a mask frame 25, ii) moving a metal sheet 10 to which an electrostatic chuck 30 is attached and of which an edge portion is integrally combined with a sheet frame 15 down toward the metal mask 20, and iii) moving a magnet plate 40 provided above the metal sheet 10 down toward the metal mask 20 so as to attach the substrate S to the metal mask 20 using a magnetic force.

The present exemplary embodiment is the same as the previous exemplary embodiment, except that moving the metal sheet 10 upward to attach the metal sheet 10 to the magnet plate 40 provided above the metal sheet 10 is omitted, and therefore a repeated description thereof will be omitted.

According to at least one of the disclosed embodiments, the substrate can be prevented from being slack during a deposition process so that a change in locations of hole patterns on a mask due to the slack substrate can be prevented, and accordingly deposition location accuracy can be improved and deposition failure can be reduced. In addition, as the deposition failure is decreased, productivity can be improved and production cost can be lowered. Further, as the deposition location accuracy is improved, high-resolution deposition process can be performed.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A deposition apparatus comprising:
   a metal sheet of which an edge portion is integrally combined with a sheet frame;
   an electrostatic chuck attached to a bottom surface of the metal sheet and configured to Pull a substrate based on a static electricity force;
   a metal mask placed below the electrostatic chuck, wherein an edge portion of the metal mask is combined with a mask frame, and wherein the metal mask has a predetermined patterned opening where the substrate is mounted to an upper surface thereof;
   a magnet plate placed above the metal sheet, and configured to pull the metal mask based on a magnetic force so as to attach the substrate to the electrostatic chuck wherein the magnet plate, the metal sheet, the electrostatic chuck, the metal mask, and a deposition source are placed inside the chamber, and a deposition source is configured to supply a deposition material to the metal mask.

2. The deposition apparatus of claim 1, further comprising:
   a sheet frame driver configured to transfer the sheet frame up or down; and
   a magnet plate driver configured to transfer the magnet plate up or down.

3. The deposition apparatus of claim 1, wherein the electrostatic chuck comprises a film type of electrostatic chuck.

4. The deposition apparatus of claim 1, wherein the electrostatic chuck is configured to be attached to the metal sheet while being convex downward.

5. The deposition apparatus of claim 1, wherein the magnet plate is formed of a permanent magnet or an electromagnet.

6. The deposition apparatus of claim 1, wherein the metal mask comprises a fine metal mask.

7. The deposition apparatus of claim 1, wherein the metal sheet and the electrostatic chuck have substantially the same curvature.

8. The deposition apparatus of claim 1, wherein the magnet plate is placed directly above the metal sheet.

9. The deposition apparatus of claim 1, wherein the electrostatic chuck is configured to be placed directly above the substrate.

10. The deposition apparatus of claim 1, wherein the magnet plate, the metal sheet, the electrostatic chuck and the metal mask overlap in the direction of the magnetic force.

* * * * *